(12) United States Patent  
Hernandez-Marti et al.

(10) Patent No.: US 7,586,313 B2
(45) Date of Patent: Sep. 8, 2009

(54) DETERMINING ELECTRICAL CHARACTERISTICS OF AN ELECTRICAL CABLE

(75) Inventors: Ramon Hernandez-Marti, Houston, TX (US); Vinod Rajasekaran, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 86 days.

(21) Appl. No.: 11/740,739

(22) Filed: Apr. 26, 2007

(65) Prior Publication Data

US 2008/0265898 A1 Oct. 30, 2008

(51) Int. Cl.
*G01R 31/04* (2006.01)

(52) U.S. Cl. ............... 324/538; 340/853.2; 340/853.7; 340/854.1; 702/6; 702/183; 702/FOR. 102

(58) Field of Classification Search ........... 324/538, 324/323
See application file for complete search history.

(56) References Cited

U.S. PATENT DOCUMENTS

| | | | |
|---|---|---|---|
| 3,459,956 A | 8/1969 | Brock | |
| 3,603,923 A | 9/1971 | Nelligan | |
| 3,916,685 A | 11/1975 | Paap | |
| 4,605,268 A | 8/1986 | Meador | |
| 4,720,996 A | 1/1988 | Marsden | |
| 4,845,493 A * | 7/1989 | Howard | 340/853.7 |
| 5,081,411 A | 1/1992 | Walker | |
| 5,091,725 A * | 2/1992 | Gard | 340/854.1 |
| 5,237,264 A | 8/1993 | Moseley | |
| 5,530,748 A | 6/1996 | Ohmori | |
| 6,148,263 A * | 11/2000 | Brooks et al. | 702/6 |
| 6,459,271 B1 * | 10/2002 | Vokey et al. | 324/522 |
| 6,522,119 B1 | 2/2003 | Hernandez | |
| 6,841,984 B2 | 1/2005 | Hernandez | |
| 7,009,312 B2 | 3/2006 | Hernandez-Marti | |
| 7,023,675 B2 | 4/2006 | Ha | |
| 7,154,412 B2 | 12/2006 | Dodge | |
| 7,233,081 B2 | 6/2007 | Tokuda | |
| 2005/0200497 A1 * | 9/2005 | Smithson et al. | 340/853.3 |
| 2007/0116184 A1 * | 5/2007 | Gonsalves et al. | 379/1.01 |

* cited by examiner

*Primary Examiner*—Timothy J Dole
*Assistant Examiner*—Benjamin M Baldridge
(74) *Attorney, Agent, or Firm*—Michael Flynn; David Cate; Jaime Castano

(57) ABSTRACT

To characterize an electrical cable that is deployed in a well, a voltage input is applied to the electrical cable at an earth surface location, where the well extends from the earth surface location. A current response resulting from the voltage input is measured at the earth surface location. At least one parameter of the electrical cable is computed according to the measured current response.

23 Claims, 5 Drawing Sheets

DETERMINING ELECTRICAL CHARACTERISTICS OF AN ELECTRICAL CABLE

TECHNICAL FIELD

The invention relates generally to determining electrical characteristics of an electrical cable for deployment in a well.

BACKGROUND

Electrical logging refers generally to the surveying of oil or gas wells to determine their geological, petro-physical, or geophysical properties using electronic measuring instruments. The electronic measuring instruments are conveyed into a wellbore with an electrical cable (e.g., an armored steel cable), often referred to as a wireline cable. Measurements made by downhole instruments secured to the wireline cable are transmitted back to a data processing system located at the earth surface through electrical conductors in the wireline cable. Electrical, acoustical, nuclear and imaging tools are used to stimulate the formations and fluids within the wellbore and the electronic measuring instruments then measure the response of the formations and fluids. The wireline cable provides also the electrical power required by the logging tools to operate.

From an electric power perspective, a wireline logging system may be viewed as an electrical circuit having a head resistance (Rh) representing the downhole instruments in series with an impedance element representing the wireline cable itself. If the wireline cable is modeled as a simple resistive element, FIG. 1 illustrates a circuit diagram of the system. In this simple model, a voltage Vs from a voltage source is applied across the series combination of the cable resistance (Rc) and the head resistance Rh.

Two competing considerations govern wireline logging operations. On the one hand, it is desirable to maximize the power delivered to the head (tools) to maximize the rate of data acquisition and to speed up operations in general. Maximum power is delivered to the load when the cable resistance Rc equals the head resistance Rh and the voltage at the head Vh is half the source voltage Vs. Under these conditions, however, the load voltage Vh varies by approximately 100% when the load impedance (Rh) goes from this value to almost open circuit, which occurs when heavy loads are disconnected and only the control circuits remain powered. This variation is typically unacceptable for electronic circuits in general, and in wireline logging systems in particular. It is thus desirable to maintain a downhole voltage at a fixed value so that tools do not have to cope with changing voltages.

Referring to FIG. 2, a block diagram representing a traditional voltage regulation system 120 is illustrated. Voltage regulation system 120 compares a measured value of the load voltage $V_L$ 122 against a set voltage $V_{SET}$ 124 to determine an error signal 126. Error signal 126 is indicative of the difference between $V_L$ 122 and $V_{SET}$ 124. Error signal 126 is then typically provided to an error amplification circuit 128. The amplification circuit 128 typically includes an operational amplifier and may employ a proportional, integrating, and/or differentiating circuit depending upon the application. Amplification circuit 128 typically generates a source voltage $V_S$ from error signal 126 to maintain $V_L$ at the desired level ($V_{SET}$).

A conventional voltage regulator such as system 120 requires an accurate measurement of the load voltage $V_L$ to implement the voltage control at the voltage source. In many applications where the load is located in the proximity of the source voltage, feeding the load voltage back to the regulator presents no significant problem. In a wireline logging application, however, it is logistically impracticable to feed the load voltage back to the source because of the relatively long length of typical wireline cables. Even if the wireline cable were constructed to include a feedback cable to carry the load voltage signal back to the surface, the loss and delay that would characterize the feedback cable would result in a significantly degraded load signal.

To address the above issue, an electrical cable model of the wireline cable can be used. A voltage source signal (generated at the earth surface) is provided to the input of the electrical cable model. The output of the electrical cable model represents an approximation of the measured signal's effect on the load voltage in the actual electrical cable. This approximation can be used to alter the source voltage to cancel out the effect of the cable on the load voltage. An issue associated with using an electrical cable model to compensate for effects of a wireline cable is that, conventionally, efficient and accurate techniques of characterizing the wireline cable are typically not available.

SUMMARY

In general, according to an embodiment, a method of characterizing an electrical cable deployed in a well includes applying a voltage input at an earth surface location to the electrical cable, and measuring a current response at the earth surface location resulting from the voltage input. At least one parameter of the electrical cable is computed according to the measured current response.

Other or alternative features will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments are possible.

Figure 3:
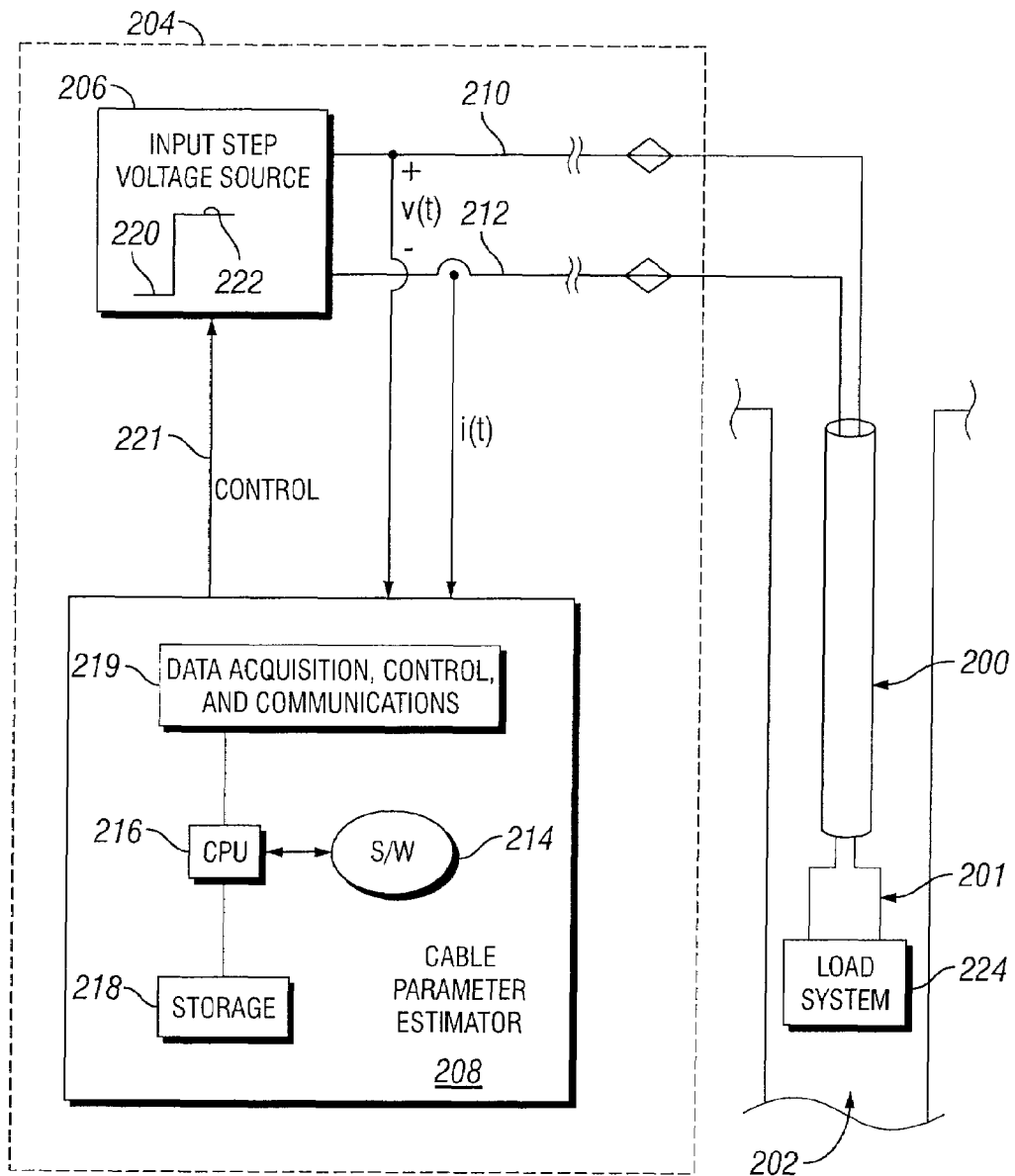
FIG. 3 is a block diagram of an arrangement that includes an input step voltage source that is connected to an electrical cable for deployment in a well, and a cable parameter estimator for characterizing the electrical cable, in accordance with an embodiment.

FIG. 3 shows an example arrangement according to an embodiment for characterizing an electrical cable 200 that is deployed in a well 202. Characterizing the electrical cable 200 refers to computing parameters that describe the electrical cable 200, where the parameters include the resistance, capacitance, and/or inductance of the electrical cable 200.

The well 202 extends from an earth surface location 204. At the earth surface location 204, an input step voltage source 206 and a cable parameter estimator 208 are provided. The input step voltage source 206 applies a voltage v(t), in the form of a step voltage, between electrical conductors 210 and 212, which are electrically connected to corresponding conductors of the electrical cable 200.

The cable parameter estimator 208 receives the voltage v(t) from conductors 210 and 212, and receives current i(t) from conductor 212. The current i(t) is the current response in the electrical cable that results from the applied input step voltage v(t). The cable parameter estimator 208 can be implemented as a computer that has software 214 executable on one or more central processing units (CPUs) 216. The cable parameter estimator 208 includes a data acquisition, control, and communications module 219 to receive v(t) and i(t), which are provided to the software 214 for processing. The data acquisition, control, and communications module 219 also provides control signaling 221 to the input step voltage source 206 to cause the input step voltage source 206 to apply the input step voltage v(t).

Based on the inputs v(t) and i(t), the software 214 is able to calculate parameters, such as the resistance R, capacitance C, and inductance L, of the electrical cable 200. The calculated parameters are stored in a storage 218.

The input step voltage v(t) applied by the input step voltage source 206 steps from a first low voltage level 220 (assumed to be zero volts in the discussion below) to a higher voltage level 222 (where the higher voltage level 222 is referred to as V below). V represents the differential voltage between voltage levels 220 and 222. It is noted that the higher voltage level 222 is at a level that is less than the activation voltage level for a load system 224 that is connected to the distal end 201 of the electrical cable 200. Therefore, in the arrangement depicted in FIG. 3, the distal end 201 of the electrical cable 200 is considered to be open circuited (or open ended). A benefit of characterizing parameters of the cable 200 using the arrangement of FIG. 3 is that a testing circuit does not have to be connected to the distal end 201 of the electrical cable 200, since the distal end 201 is assumed to be open circuited. The cable characterization according to the arrangement of FIG. 3 can be performed using just measurements taken at the earth surface location 204, which is more efficient and less complex.

The frequency-domain input impedance of the cable with the distal end 201 open circuited can be given by:

$$Z_{in}(s) = Z_o(s)\coth(\gamma l), \quad \text{(Eq. 1)}$$

where $Z_o$ is the characteristic impedance of the line, $\gamma$ is the propagation constant, and $l$ is the length of the line. In an electrical cable used in a downhole application (where the electrical cable is relatively long, usually on the order of tens of thousands of feet), the resistance and capacitance dominate the system response characteristics. As a first approximation, the effect of line inductance can be ignored. (Note that the conductance is negligible and can be assumed to be zero without leading to any inaccuracies). Transforming this in terms of the resistance R and capacitance C of the line (where R and C are values for the entire line and not per-unit imped ances, in other words, R is the per-unit resistance multiplied by the length of the line), $$Z_{in}(s) = \sqrt{\frac{R}{sC}} \coth(\sqrt{sRC}) \quad \text{(Eq. 2)}$$

Expanding the above expression using a MacLaurin series, $$Z_{in}(s) = \sqrt{\frac{R}{sC}} \cdot \frac{1}{\sqrt{sRC}} \left( \frac{1 + \frac{sRC}{2} + \frac{s^2R^2C^2}{24} + \ldots}{1 + \frac{sRC}{6} + \frac{s^2R^2C^2}{120} + \ldots} \right) \quad \text{(Eq. 3)}$$

$$= \frac{1}{sC} \left( \frac{1 + \frac{sRC}{2} + \frac{s^2R^2C^2}{24} + \ldots}{1 + \frac{sRC}{6} + \frac{s^2R^2C^2}{120} + \ldots} \right)$$

The frequency-domain input current response, I(s), to a frequency-domain step input voltage response, V(s), of the cable can now be computed as:

$$I(s) = V(s)Y_{in}(s) \quad \text{(Eq. 4)}$$

$$= \frac{V}{s} sC \left( \frac{1 + \frac{sRC}{6} + \frac{s^2R^2C^2}{120} + \ldots}{1 + \frac{sRC}{2} + \frac{s^2R^2C^2}{24} + \ldots} \right)$$

$$= CV \left( \frac{1 + \frac{sRC}{6} + \frac{s^2R^2C^2}{120} + \ldots}{1 + \frac{sRC}{2} + \frac{s^2R^2C^2}{24} + \ldots} \right)$$

In Eq. 4, V(s) is the Laplace transform of v(t), and V represents the final voltage value (voltage level 222 in FIG. 3) of the input step voltage v(t). It is noted that the cable is not modeled as a lumped element (in which the cable is modeled as a single resistor and capacitor) but as a distributed line having RC elements (according to Eq. 4) that have been related to the resistance and capacitance of the line.

Using Eq. 4, the capacitance can be obtained by evaluating the Laplace response at s=0 (which is the DC response).

$$I(0) = CV = \int_0^\infty i(t)dt \because I(s) = \int_0^\infty i(t)e^{-st}dt \quad \text{(Eq. 5)}$$

Eq. 5 indicates that the Laplace response at s=0 (the DC response) is equivalent to integrating the current waveform i(t), measured at the earth surface location, over all time t. The integral of the current leads to the charge delivered to the cable capacitance. Based on Eq. 5, it is observed that the capacitance C can be easily derived based on just the measured current i(t), which is conveniently measured at the earth surface.

Although the assumption that the cable inductance is negligible is valid for electrical cables of relatively long length, it is noted that such an assumption is not valid for shorter length cables. With a short length cable, the inductance of the cable becomes significant compared to the resistance of the cable at the frequencies of interest, and as a result, the inductance should be taken into account to obtain a better approximation. In this scenario, the system is modeled as an RLC distributive model, rather than just the RC model discussed above. With this model, the second order approximate frequency-domain current response can be represented as:

$$I(s) = V(s)Y_{in}(s) = CV \left( \frac{1 + \frac{sRC}{6} + s^2\left(\frac{R^2C^2}{120} + \frac{LC}{6}\right)}{1 + \frac{sRC}{2} + s^2\left(\frac{R^2C^2}{24} + \frac{LC}{2}\right)} \right), \quad \text{(Eq. 6)}$$

where L represents the overall inductance of the cable.

Figure 7:
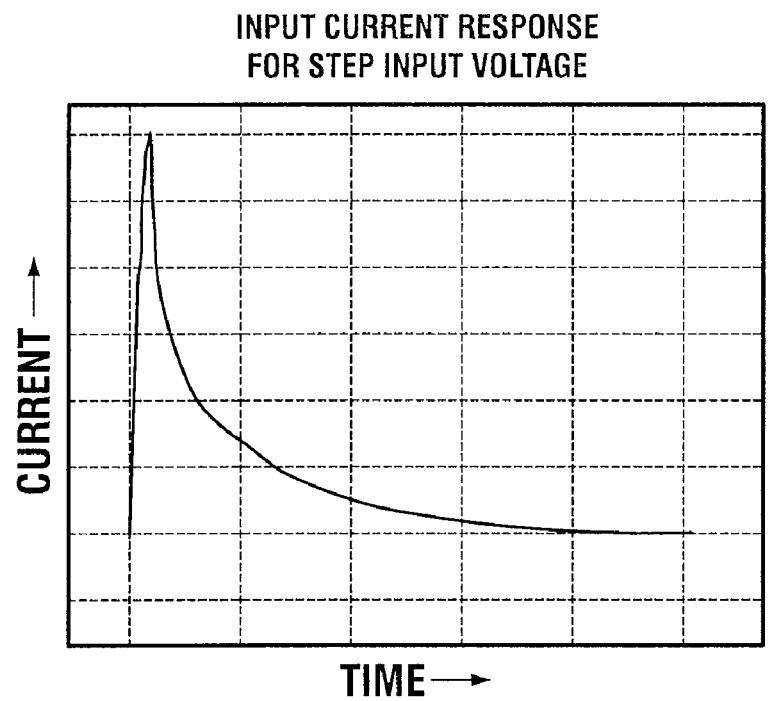
FIGS. 7 and 8 are graphs illustrating current responses of the electrical cable in response to an applied step voltage, assuming that the distal end of the electrical cable is open-circuited.
Figure 8:
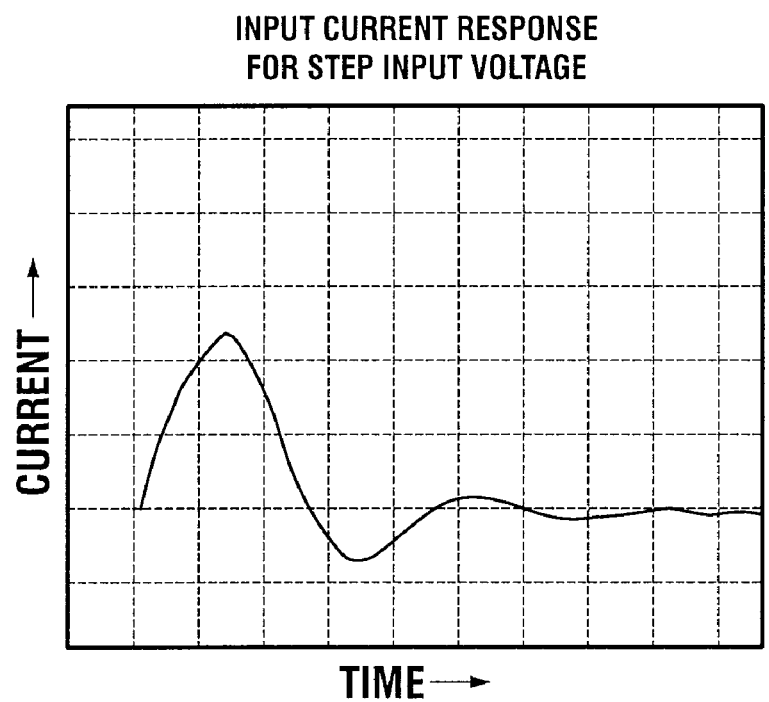

An example current response i(t) for a relatively long cable (e.g., 30,000 feet) is depicted in FIG. 7. An example current response i(t) for a relatively short cable (e.g., 7,000 feet) is depicted in FIG. 8. In both examples, it is assumed that the distal end of the cable is open-circuited, and the applied input voltage is a step voltage.

The derivative of the Laplace transform I(s) can be decomposed into a constant term and a term that contains terms in s and higher powers of s:

$$\frac{dI}{ds} = CV\left(\frac{1}{6} - \frac{1}{2}\right)RC + o(s) = \frac{-CV \cdot RC}{3} + o(s) \quad \text{(Eq. 7)}$$

$$\Rightarrow \left.\frac{dI}{ds}\right|_{s=0} = \frac{-CV \cdot RC}{3} \because o(s)|_{s=0} = 0$$

Evaluating $$\frac{dI}{ds}$$

with s=0 (which represents the DC response) results in the value $$\frac{-CV \cdot RC}{3},$$

as indicated by Eq. 7 above. Relating I(s) and $$\frac{dI}{ds}$$

to the time domain, the Laplace transform and its derivative are given by:

$$I(s) = \int_0^\infty i(t)e^{-st} dt \Rightarrow \frac{dI}{ds} = \int_0^\infty -ti(t)e^{-st} dt \quad \text{(Eq. 8)}$$

$$\Rightarrow \left.\frac{dI}{ds}\right|_{s=0} = \int_0^\infty -ti(t)dt = \frac{-CVRC}{3}$$

From the above, once the capacitance C is obtained, it is seen that the resistance R can be obtained by integrating the current multiplied by time over all time. With this simplification, the resistance and capacitance can be obtained from two simple integrals. Also, if the procedure is extended further, and the next integral with higher power of time is obtained, an estimate the inductance can also be derived. Thus, R, L, and C are calculated as follows:

$$A_0 = \int_0^\infty i(t)dt; \quad A_1 = \int_0^\infty ti(t)dt; \quad A_2 = \int_0^\infty t^2 i(t)dt \quad \text{(Eq. 9)}$$

$$C = \frac{A_0}{V}; \quad R = \frac{3A_1 V}{A_0^2}; \quad L = \frac{3V}{2A_0}\left(\frac{12}{5}\frac{A_1^2}{A_0^2} - \frac{A_2}{A_0}\right)$$

Figure 1:
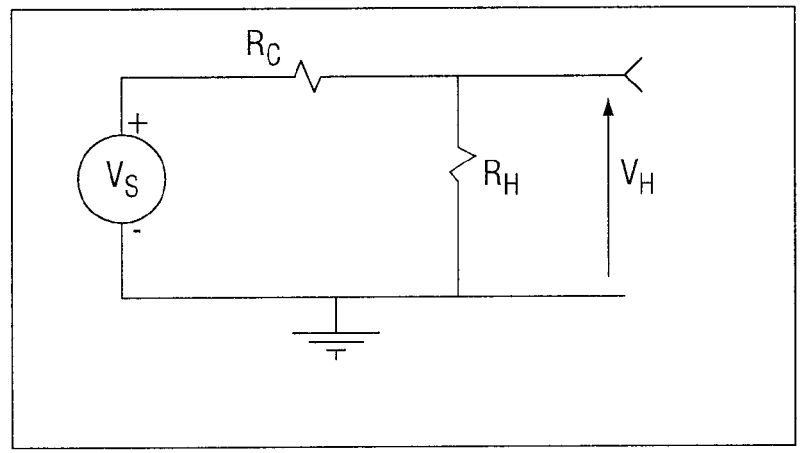
FIG. 1 is a circuit diagram of a resistive model of a wireline logging system.
Figure 2:
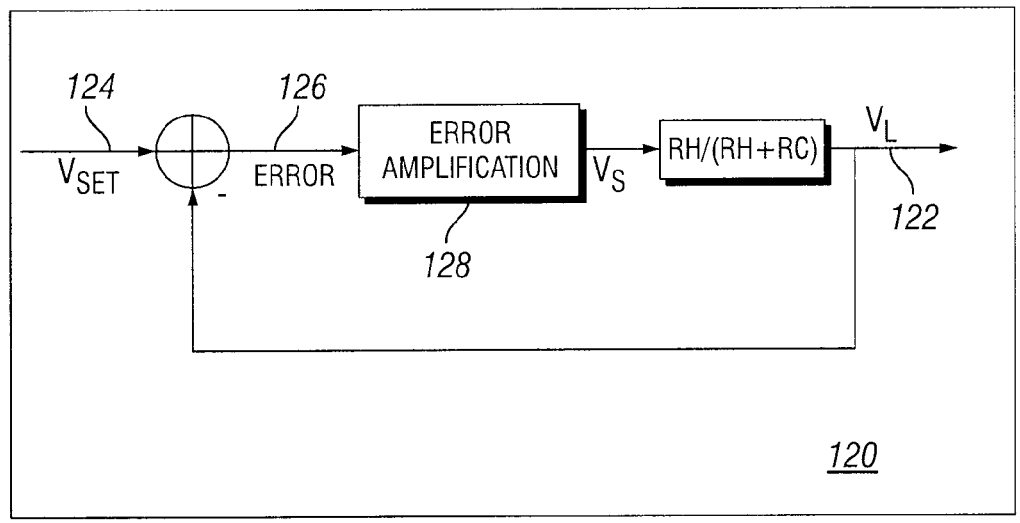
FIG. 2 represents an electrical system employing a conventional voltage control mechanism to control a load voltage.

An issue associated with the above analysis is that it is assumed that the input voltage, v(t) is assumed to be an ideal step voltage (with zero rise time from input voltage level 220 to input voltage level 222 in FIG. 1). However, with real systems, the input step is associated with a non-zero rise time (in other words, there is a finite slew rate associated with the voltage input). Mathematically the input voltage $V_{in}(s)$ can be given in the Laplace domain as a function of the time $t_1$ at which the ramp saturates:

$$V_{in}(s) = V\left(\frac{1 - e^{-st_1}}{s^2}\right). \quad \text{(Eq. 10)}$$

The time $t_1$ is the rise time to go from voltage level 220 to voltage level 222. Using the Eq. 10 expression, the current response I(s) can be computed as:

$$I(s) = V_{in}(s)Y_{in}(s) \quad \text{(Eq. 11)}$$

$$= sCV \left( \frac{1 + \frac{sRC}{6} + s^2\left(\frac{R^2C^2}{120} + \frac{LC}{6}\right)}{1 + \frac{sRC}{2} + s^2\left(\frac{R^2C^2}{24} + \frac{LC}{2}\right)} \right)\left(\frac{1 - e^{-st_1}}{s^2}\right)$$

$$= CV \left( \frac{1 + \frac{sRC}{6} + s^2\left(\frac{R^2C^2}{120} + \frac{LC}{6}\right)}{1 + \frac{sRC}{2} + s^2\left(\frac{R^2C^2}{24} + \frac{LC}{2}\right)} \right)\left(\frac{1 - e^{-st_1}}{s}\right)$$

Using the same procedure as before it is easy to derive that:

$$A_0 = \int_0^\infty i(t)dt = I(0) = CV \quad \text{(Eq. 12)}$$

$$A_1 = \int_0^\infty ti(t)dt = CV\left(\frac{RC}{3} + \frac{t_1}{2}\right)$$

L'Hospital's rule was used to obtain the limits at s=0 as the function is of 0/0 form. The second integral area is not only dependent on the resistance and capacitance but also has a contribution from the ramp rate $t_1$ of the voltage input, $A_1$. With the above, the resistance and capacitance values of the cable can be given as:

$$C = \frac{A_0}{V}, \quad \text{(Eq. 13)}$$

$$R = \frac{3V}{A_0}\left(\frac{A_1}{A_0} - \frac{t_1}{2}\right),$$

$$L = \frac{3}{2C}\left(\frac{t_1^2}{3} + \frac{4}{15}(RC)^2 - \frac{1}{3}(RC)t_1 - \frac{A_2}{A_0}\right).$$

Once the parameters of the electrical cable 200 are known, then a head voltage control procedure can be performed for stabilizing the head voltage. A two-port model with Y (ad mittance)—elements (shunt-type) can be obtained to represent the cable model as below:

$$\begin{bmatrix} I_1(s) \\ I_2(s) \end{bmatrix} = \begin{bmatrix} Y_{11}(s) & Y_{12}(s) \\ -Y_{12}(s) & -Y_{11}(s) \end{bmatrix} \begin{bmatrix} V_1(s) \\ V_2(s) \end{bmatrix},$$ (Eq. 14)

where $V_1$ and $I_1$ are the surface voltage and current, and $V_2$ and $I_2$ are the head voltage and current, respectively. Note that there are only two frequency-dependent functions, $Y_{11}(s)$ and $Y_{12}(s)$, that model the cable completely due to the symmetrical nature of the cable. Hence, the frequency-dependent admittances can be obtained from the short and open-circuit impedances of the cable as:

$$Y_{11}(s) = \frac{1}{Z_{sc}},$$ (Eq. 15)

$$Y_{12}(s) = \frac{1}{Z_{sc}}\sqrt{\frac{Z_{oc} - Z_{sc}}{Z_{oc}}}.$$ (Eq. 16)

With the above frequency domain characterization of the Y-parameters, the head voltage $V_2$ can be easily obtained from surface measurements by rewriting Eq. 14 as:

$$V_2(s) = -\frac{Y_{11}(s)}{Y_{12}(s)}\left(V_1(s) - I_1(s)\frac{1}{Y_{11}(s)}\right).$$ (Eq. 17)

Note that in the low frequencies, $Z_{oc} \gg Z_{sc}$ and therefore $V_h(s) = (V_s(s) - I_s(s) \cdot Z_{sc}(s))$. In accordance with some embodiments, instead of estimating the $Y_{11}(s)$ and $Y_{12}(s)$ transfer functions using frequency domain measurements of the cable, the resistance and capacitance as computed above are used to calculate $Y_{11}(s)$ and $Y_{12}(s)$. The transfer functions $Y_{11}(s)$ and $Y_{12}(s)$ can be related to the primary parameters of characteristic impedance and attenuation as:

$$Y_{11}(s) = \frac{1}{Z_{sc}} = \frac{1}{Z_o \tanh(\gamma l)},$$ (Eq. 18)

$$-\frac{Y_{11}(s)}{Y_{12}(s)} = \cosh(\gamma l).$$ (Eq. 19)

Neglecting the inductance of the line and using a first order MacLaurin rational expansion of the frequency domain functions, these transfer functions can be expressed in terms of the resistance and capacitance of the line as:

$$Z_{sc}(s) = Z_o \tanh(\gamma l) = R\left(\frac{1 + \frac{sRC}{6}}{1 + \frac{sRC}{2}}\right),$$ (Eq. 20)

$$\cosh(\gamma l) = 1 + \frac{sRC}{2},$$

$$\therefore Z_o = \sqrt{\frac{R}{sC}} \text{ and } \gamma l = \sqrt{sRC}.$$

In other words, once $Z_o$ and $\gamma l$ are calculated based on R and C according to Eq. 20, then the transfer functions $Y_{11}(s)$ and $Y_{12}(s)$ can be easily derived using Eqs. 18 and 19.

The admittance transfer functions $Y_{11}(s)$ and $Y_{12}(s)$ provide the model of the electrical cable 200. Once the model is known, then a compensation technique can be applied to maintain a desired set voltage at the head (load system 224).

Characterization of cable parameters discussed above involves the assumption that the distal end 201 (FIG. 3) of the cable is an open circuit. However, in some scenarios, such an assumption may not be valid. For example, in some scenarios, the load system 224 shown in FIG. 3 may be associated with a capacitance, such as a power supply capacitance, that can degrade the accuracy of the capacitance measurement, which in turn can degrade the resistance measurement.

In a different embodiment, instead of using a characterization procedure that assumes an open circuit at the distal end of the electrical cable 200, a short circuit at the distal end 201 is assumed instead. Providing a short circuit at the distal end has the benefit that the characterization of parameters of the cable is not tool-dependent. With the open-circuit assumption, different types of tools can be associated with different tool capacitances, which in some cases may degrade accuracy of the parameter estimates.

Figure 4:
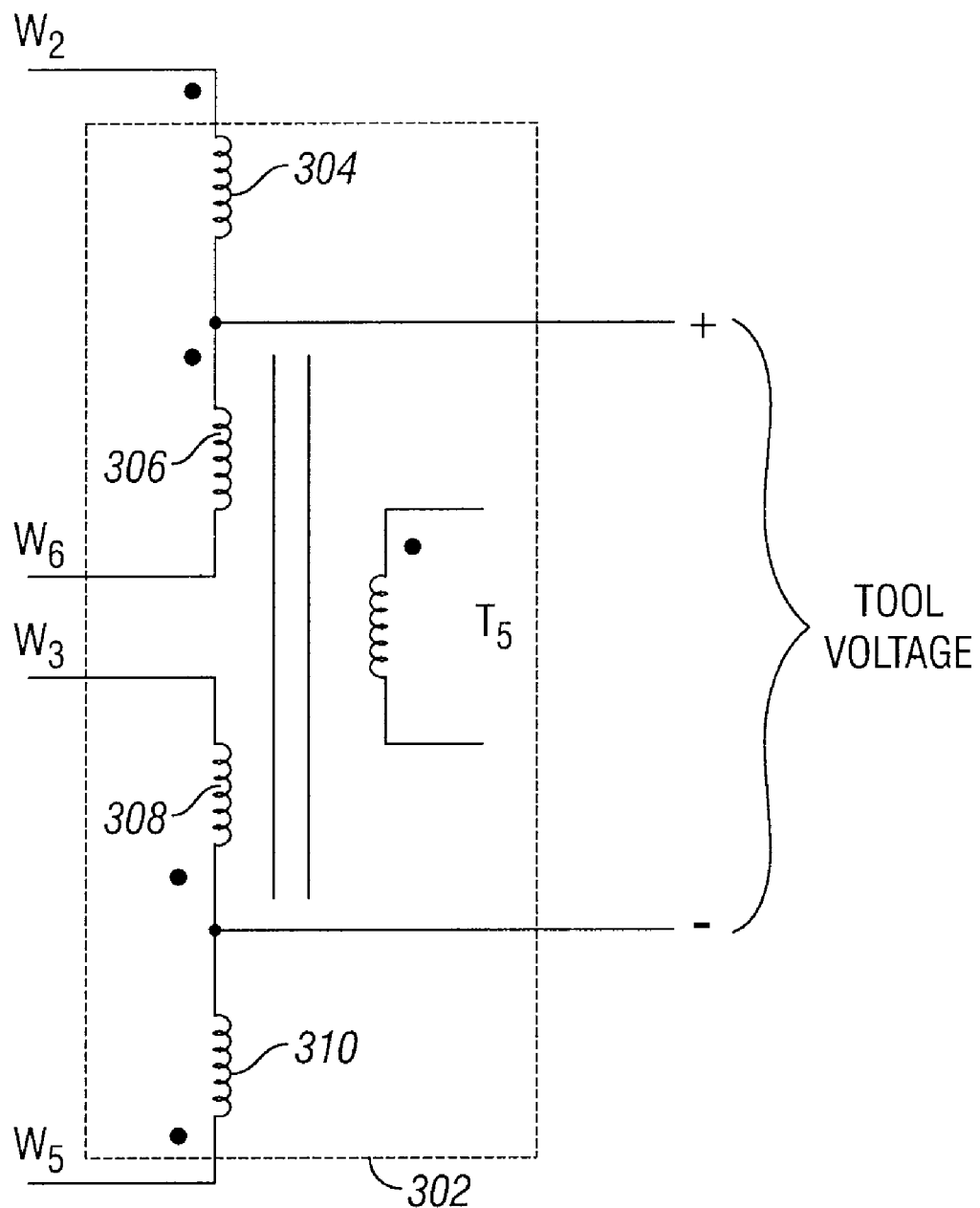
FIG. 4 illustrates a downhole transformer that is connected to conductors of a multi-conductor cable.

In some implementations, transformers are part of the load system 224 that is connected to the distal end 201 of the electrical cable 200. For example, as shown in FIG. 4, the load system has a transformer 302 that transforms a voltage of a multi-conductor cable (e.g., six-conductor cable) to a tool voltage for powering the load system 224. The transformer 302 also allows coupling of power and telemetry. The transformer 302 has windings 304 and 306 that connect electrical conductors W2 and W6 of the multi-conductor electrical cable. In the low frequency domain of interest for power transmission, the windings 304 and 306 effectively provide a short circuit between conductors W2 and W6. With circuitry at the earth surface (such as in the data acquisition, control, and communication module 219 of FIG. 3, a direct electrical connection can be made to the electrical conductors W2 and W6 at the earth surface to bypass the surface transformer (not shown) similar to the downhole transformer 302. By providing this direct electrical connection to conductors W2 and W6 of the multi-conductor electrical cable, the short circuit at the tool end due to the transformer 302 can be used to determine the characteristics of the cable. Note that in alternative implementations, the short circuit can be provided between conductors W3 and W5 of the multi-conductor cable through windings 308 and 310 of the transformer 302.

The input impedance of the cable with the distal end short circuited can be given by:

$$Z_{in}(s) = Z_o(s)\tanh(\gamma l)$$ (Eq. 21)

where $Z_o$ is the characteristic impedance of the line, $\gamma$ is the propagation constant and l is the length of the line. In long cables, the resistance and capacitance dominate the system response characteristics. As a first approximation, the effect of line inductance can be neglected. Transforming this in terms of the resistance R and capacitance C of the cable, $$Z_{in}(s) = \sqrt{\frac{R}{sC}} \tanh(\sqrt{sRC}).$$ (Eq. 22)

Expanding the above expression using a MacLaurin series, $$Z_{in}(s) = \sqrt{\frac{R}{sC}} \cdot \sqrt{sRC} \left( \frac{1 + \frac{sRC}{6} + \frac{s^2R^2C^2}{120} + \ldots}{1 + \frac{sRC}{2} + \frac{s^2R^2C^2}{24} + \ldots} \right) \quad \text{(Eq. 23)}$$

$$= R \left( \frac{1 + \frac{sRC}{6} + \frac{s^2R^2C^2}{120} + \ldots}{1 + \frac{sRC}{2} + \frac{s^2R^2C^2}{24} + \ldots} \right).$$

The frequency-domain input current response, I(s), to a step input voltage response, V(s), of the cable can now be computed as:

$$I(s) = V(s)/Z_{in}(s) = \frac{V}{sR} \left( \frac{1 + \frac{sRC}{2} + \frac{s^2R^2C^2}{24} + \ldots}{1 + \frac{sRC}{6} + \frac{s^2R^2C^2}{120} + \ldots} \right). \quad \text{(Eq. 24)}$$

The resistance R of the cable can be easily derived using the Final Value Theorem by determining the electrical current at time t=∞:

$$R = V/I(\infty), \quad \text{(Eq. 25)}$$

where I(∞) is the steady state current after initial transients. The resistance of the cable is basically the voltage divided by the steady state current. The capacitance of the cable can be estimated from the decay of the current assuming a first order decay as:

$$I(s) = \frac{I(\infty)}{sR} \left( \frac{1 + \frac{sRC}{2} + \frac{s^2R^2C^2}{24} + \ldots}{1 + \frac{sRC}{6} + \frac{s^2R^2C^2}{120} + \ldots} \right). \quad \text{(Eq. 26)}$$

For a general decay from $I_1$ to $I_2$ at times $t_1$ and $t_2$, the RC time constant can be obtained from the above as:

$$RC = \frac{6(t_2 - t_1)}{\ln\left(\frac{I_1 - I(\infty)}{I_2 - I(\infty)}\right)}. \quad \text{(Eq. 27)}$$

From Eq. 27 above, since the resistance R is known, the capacitance C can be readily derived based on the values of R, $I_1$, $I_2$, $t_1$, and $t_2$.

Figure 5:
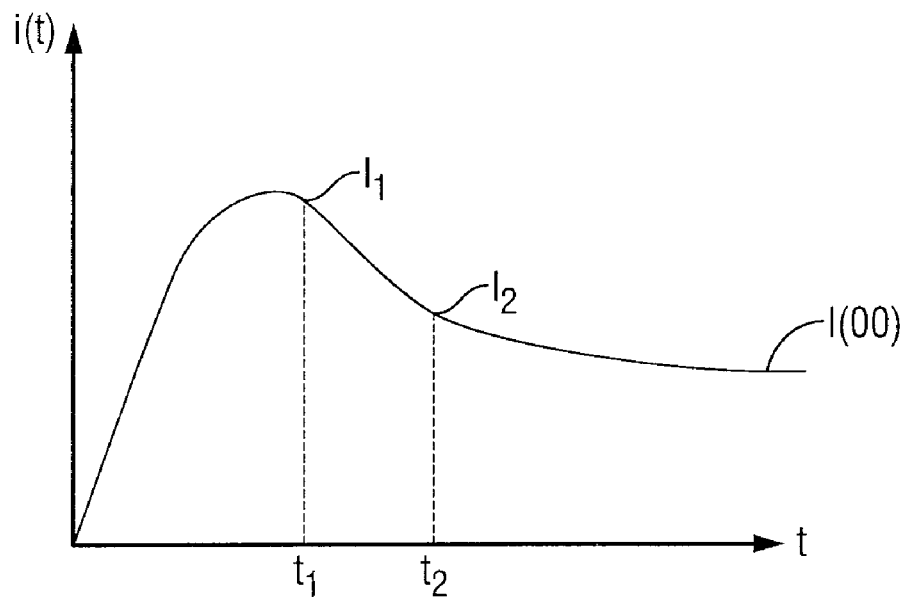
FIGS. 5 and 6 are graphs illustrating current responses of the electrical cable in response to an applied step voltage, assuming that the distal end of the electrical cable is short-circuited.

An example current response over time (for a relatively long cable with its distal end short-circuited) is illustrated in the graph of FIG. 5, which shows the current i(t) initially rising to a peak current and then decaying to a steady state current I(∞) at time t =∞. The current response for the relatively long cable is a damped response. Two instantaneous values $I_1$ and $I_2$ can be picked at any two time instants $t_1$ and $t_2$ (that are sufficiently far apart to obtain a sufficiently good approximation), as depicted in FIG. 5, to allow for computation of C once R is computed based on the stead state current I(∞).

Figure 6:
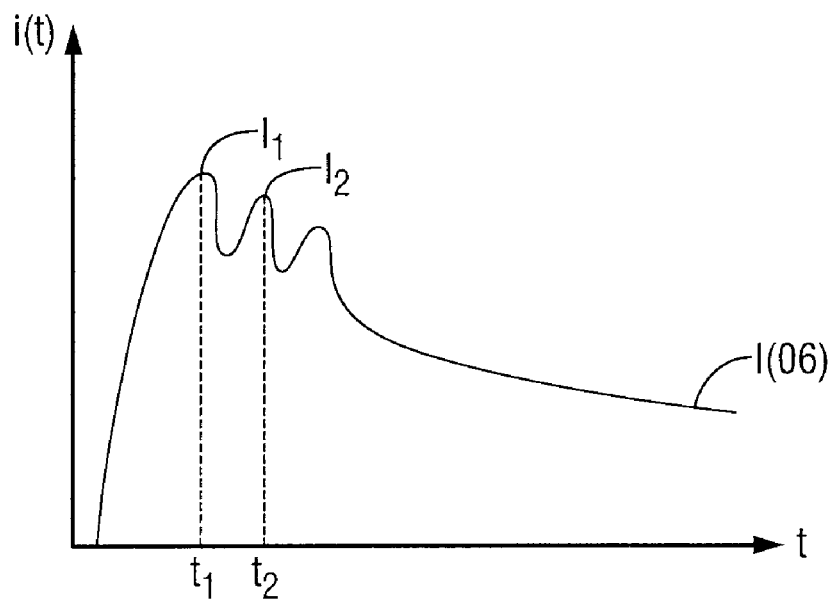

For a shorter cable with its distal end short-circuited, an over-damped response exists, which can result in oscillations in the current waveform i(t), as depicted in FIG. 6. In the short cable case, Eq. 27 can be extended with the assumption that the envelope of the oscillatory behavior will give us the RC time constant of the cable as defined in the equation. A practical implementation for example could be based on $I_1$ and $I_2$ being the peaks of the oscillatory waveform at times $t_1$ and $t_2$, as depicted in FIG. 6, and the above stated Eq. 27 would still hold for computing the capacitance C.

The parameters of the cable will likely change during operation (e.g., logging operation) in the well. The change may be due to temperature rise as a result of the raised temperature in the wellbore and the operation causing heating of the cable due to current flow in the cable.

As a first approximation, the resistance of the cable can be assumed as the only variable that changes (in other words, in this approximation, the capacitance is assumed constant). In one example, a typical cable telemetry link has a latency greater than 100 ms (the interval of time needed to make a measurement), and thus, a well operator can obtain a few measurements every second.

By communicating downhole voltage and current measurements to the well surface, a well operator can easily update the resistance when the load changes. Ideally the steady state downhole voltage stays constant after the load current changes. If the system is under-compensated (in other words, the resistance used in the cable loop model is less than the actual cable resistance), then the steady state downhole voltage will be less than the nominal set voltage with the difference being proportional to the current. If the downhole voltage decreases with a rise in current, that is an indication that the system is under-compensated. On the other hand, if the downhole voltage increases with a rise in current, then the system is over-compensated. The cable model resistance can be corrected based on such measurements to ensure a constant steady state downhole voltage at the load system 224.

Various different implementations are discussed below to enable the update of resistance values without using downhole current measurements (in other words, the only downhole measurements used are voltage measurements). A first implementation uses a "dead beat updater" technique. With this technique, a static measurement of the downhole voltage can be compared with an estimated voltage obtained from a sufficiently large number of samples around that time stamp for the surface voltage and current, respectively. If the surface voltage and current have not changed beyond a certain amount in that time frame, the resistance is updated. Simple calculations of the surface voltage using the downhole measurement and the control loop leads to:

$$V_{1,meas} = V_{2,meas} + I_1 R_{exact} \quad \text{(Eq. 28)}$$

$$V_{1,meas} = V_{2,set} + I_1 R_{est}$$

$$\Rightarrow R_{exact} = R_{est} - \left(\frac{V_{2,meas} - V_{2,set}}{I_1}\right).$$

In Eq. 28, $I_1$ is the surface current, $V_{1,meas}$ is the measured surface voltage, $V_{2,meas}$ is the measured downhole voltage, $V_{2,set}$ is the target downhole voltage, $R_{exact}$ is the exact resistance of the cable, and $R_{est}$ is the estimated resistance of the cable according to the techniques discussed above using either the open-circuited or short-circuited assumptions. The voltages and current of Eq. 28 are steady state voltages and current. Based on Eq. 28, it can be seen that the resistance can be updated to produce the correct resistance $R_{exact}$ based on the estimated resistance $R_{est}$, measured surface current $I_1$, measured downhole voltage $V_{2,meas}$, and target downhole voltage $V_{2,set}$. From an update perspective, the above equation can be reformulated as:

$$R_{m+1} = R_m - \left(\frac{V_{2,m} - V_{2,set}}{I_m}\right). \quad \text{(Eq. 29)}$$

In Eq. 29, $R_{m+1}$ represents the updated resistance value (corresponding to the correct resistance value $R_{exact}$), $R_m$ represents the current resistance value (corresponding to the estimated resistance value $R_{est}$), $I_m$ is the current surface current, $V_{2,m}$ is the measured downhole voltage (same as $V_{2,meas}$), and $V_{2,set}$ is the target downhole voltage. Note that $V_{2,m}$ and $I_m$ can be averages of several voltage and current values. As noted above, the update of the resistance is performed if the surface voltage and current has not changed in the time frame during which the downhole voltage measurements are made, which indicates that a steady state has been reached.

Note that the surface current $I_1$ used is at the same time stamp as the measured downhole voltage $V_{2,meas}$. The above procedure may lead to inaccurate results if there are local oscillations downhole leading to a constant surface voltage and current but a varying head voltage; in other words, the head voltage control is working imperfectly in which case there will be small variations around the voltage set-point.

A second implementation to address a potential shortcoming of the first implementation is to update at a certain rate using a steepest descent type algorithm. With an update rate factor of $\mu$ (where $\mu$ is a correction factor to correct the updated resistance $R_{m+1}$), the cable resistance update equation can be reformulated as:

$$R_{m+1} = R_m - \mu\left(\frac{V_{2,m} - V_{2,set}}{I_m}\right). \quad \text{(Eq. 30)}$$

Alternatively, in a third implementation, a heuristic approach can be used. Ideally, it is desired that the downhole voltage estimate obtained using the cable model matches the measured downhole voltage. If the difference between these two values is computed, then the resistance is updated depending on the sign of the difference (with some predefined threshold $\Delta V$), as follows:

$R_{m+1} = R_m + \Delta R$ if $V_{2,est} > V_{2,meas} + \Delta V$ $R_{m+1} = R_m - \Delta R$ if $V_{2,est} < V_{2,meas} + \Delta V$ $R_{m+1} = R_m$ if $|V_{2,meas} - V_{2,est}| < \Delta V$ (Eq. 31)

According to Eq. 31, the resistance is updated by adding a predefined delta value, $\Delta R$, based on a comparison of the measured downhole voltage $V_{2,meas}$ and the estimated voltage $V_{2,est}$. The heuristic method has the advantage of not relying on measurement accuracies as the update is by a fixed amount ($\Delta R$).

The choice of the implementations above depends on various factors. The first and second implementations have the benefit of faster conversions, since the resistance can be updated to its correct value faster, but may suffer from oscillations as compared to the third implementation. The choice of the implementation is dependent on the accuracy of measurements and the stability of the voltage regulation loop.

A fourth implementation uses a statistical updater technique, which uses several voltage and current samples to compensate for possible variations in the measurements. For simplicity of discussion, it is assumed that the only parameter modeled is the cable resistance. The basic equation is:

$$V_2 = V_{2,set} + I_1(R_{est} - R_{exact}) \quad \text{(Eq. 32)}$$

The downhole voltage sampling rate is assumed to be 60 Hz (hertz). Simultaneous sampling of downhole voltage and surface current is assumed to not be possible. The correction technique according to the fourth implementation is based on averaged values during a second interval or more. It can be shown that, for each averaging interval, and with the assumption that changes in cable resistance are much slower than changes in current, and that these are uncorrelated:

$E(V_2) = V_{2,set} + E(I_1)(R_{est} - R_{exact})$, $\sigma^2(V_2) = \sigma^2(I_1)(R_{est} - R_{exact})^2$ (Eq. 33)

where $E(V_2)$ represents the average of several downhole measured voltage samples, $E(I_1)$ represents the average of several measured surface current samples, and $\sigma$ represents the variance (of the current or voltage). It is assumed that the cable resistance is constant during the averaging interval (during which several current measurements are made and averaged).

The objective of the compensation is to make $V_2$ insensitive to the changes in supply current $I_1$, which is achieved if and only if $R_{est} = R_{exact}$. Consequently, $$R_{exact} = R_{est} + \frac{(V_{2,set} - E(V_2))}{E(I_1)}. \quad \text{(Eq. 34)}$$

According to Eq. 34, the update of the resistance is based on taking several samples of the measured downhole voltage and the measured surface current.

Another potential source of error is the uncertainty in the measurement of downhole voltage. Averaging can reduce random variations, or noise, but offsets cannot be averaged out. An offset refers to a DC offset, and is represented as $V_{offset}$. Any offset will appear as added (or subtracted, depending on the sign) to the cable resistance estimate:

$$R_{exact} = R_{est} + \frac{(V_{2,set} - E(V_2) + V_{offset})}{E(I_1)} \quad \text{(Eq. 35)}$$

The term $V_{offset}/E(I_1)$ has been removed from the new cable resistance estimate. It can be seen from the above equations that this will result in higher variance of downhole voltage. We can also obtain an estimate of the absolute value of the model error:

$$|R_{est} - R_{exact}| = \frac{\sigma(V_2)}{\sigma(I_1)}. \quad \text{(Eq. 36)}$$

There are various options available using the statistical updater the choice of which depends on the accuracy of the measurements:
(a) use Eq. 34 to update the model. Its accuracy can be monitored through the variance of downhole voltage, $\sigma^2(V_2)$, given by Eq. 33.
(b) use Eq. 36 to update the absolute value for the cable resistance model and Eq. 35 to provide the sign for the update. Accuracy can be determined by monitoring variance of $\sigma^2(V_2)$.

(c) use Eq. 36 only and reverse the sign of the model update if $\sigma(V_2)/\sigma(I_1)$ is found to jump increase from one averaging period to the next.

Instructions of software described above (including software 214 of FIG. 3) are loaded for execution on a processor (such as one or more CPUs 216 in FIG. 3). The processor includes microprocessors, microcontrollers, processor modules or subsystems (including one or more microprocessors or microcontrollers), or other control or computing devices. As used here, a "controller" refers to hardware, software, or a combination thereof. A "controller" can refer to a single component or to plural components (whether software or hardware).

Data and instructions (of the software) are stored in respective storage devices, which are implemented as one or more computer-readable or computer-usable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

While the invention has been disclosed with respect to a limited number of embodiments, those skilled in the art, having the benefit of this disclosure, will appreciate numerous modifications and variations therefrom. It is intended that the appended claims cover such modifications and variations as fall within the true spirit and scope of the invention.

What is claimed is:

1. A method of characterizing an electrical cable that is deployed in a well, comprising:

applying a voltage input to the electrical cable at an earth surface location, wherein the well extends from the earth surface location;

measuring a current response in the electrical cable resulting from the voltage input, wherein the current response is measured at the earth surface location; and computing at least one parameter of the electrical cable according to the measured current response, wherein a load system is connected to a distal end of the electrical cable, and wherein applying the voltage input comprises applying the voltage input that steps from a first voltage level to a second, higher voltage level, wherein the second voltage level is less than an activation voltage for activating the load system.

2. The method of claim 1, wherein the electrical cable is considered open-circuited due to the load system remaining deactivated, wherein applying the voltage input comprises applying the voltage input at an input end of the electrical cable at the earth surface location, and wherein measuring the current resulting from the voltage input is of a current flowing in the electrical cable with a distal end of the cable open-circuited.

3. The method of claim 1, wherein computing the at least one parameter comprises computing a capacitance of the electrical cable by integrating the measured current response over time.

4. The method of claim 3, wherein measuring the current response comprises measuring the current response for the electrical cable having its distal end open-circuited.

5. The method of claim 3, wherein computing the at least one parameter further comprises computing at least one of a resistance and inductance of the electrical cable based on integrating the current response over time.

6. The method of claim 5, wherein computing the resistance, capacitance, and inductance comprises computing resistance R, capacitance C, and inductance L according to:

$$A_0 = \int_0^\infty i(t)dt; \quad A_1 = \int_0^\infty ti(t)dt; \quad A_2 = \int_0^\infty t^2 i(t)dt$$
$$C = \frac{A_0}{V}; \quad R = \frac{3A_1 V}{A_0^2}; \quad L = \frac{3V}{2A_0}\left(\frac{12}{5}\frac{A_1^2}{A_0^2} - \frac{A_2}{A_0}\right),$$

wherein i(t) is the current response, t represents time, and V is a voltage level of the voltage input.

7. The method of claim 6, wherein the input voltage is a step voltage that steps from a first voltage level to a second voltage level, wherein computing the resistance, capacitance, and inductance comprises computing resistance R, capacitance C, and inductance L according to:

$$A_0 = \int_0^\infty i(t)dt; \quad A_1 = \int_0^\infty ti(t)dt; \quad A_2 = \int_0^\infty t^2 i(t)dt,$$
$$C = \frac{A_0}{V},$$
$$R = \frac{3V}{A_0}\left(\frac{A_1}{A_0} - \frac{t_1}{2}\right),$$
$$L = \frac{3}{2C}\left(\frac{t_1^2}{3} + \frac{4}{15}(RC)^2 - \frac{1}{3}(RC)t_1 - \frac{A_2}{A_0}\right),$$

wherein i(t) is the current response, t represents time, V is the differential voltage between the first and second voltage levels, and $t_1$ is a rise time of the voltage input from the first voltage level to the second voltage level.

8. The method of claim 1, wherein computing the at least one parameter comprises computing a resistance of the electrical cable by dividing a voltage level of the voltage input by a steady state current flowing in the electrical cable, and wherein measuring the current response comprises measuring the current response for the electrical cable having its distal end short-circuited.

9. The method of claim 8, further comprising:

identifying a first current value of the current response at a first time point;

identifying a second current value of the current response at a second time point;

wherein computing the at least one parameter further comprises computing a capacitance of the electrical cable based on the computed resistance, the first and second current values, the first and second time points, and the steady state current.

10. The method of claim 9, wherein computing the resistance and capacitance comprises computing a resistance R and a capacitance C according to $$R = V/I(\infty), \text{ and}$$
$$RC = \frac{6(t_2 - t_1)}{\ln\left(\frac{I_1 - I(\infty)}{I_2 - I(\infty)}\right)},$$

where V is a voltage level of the voltage input, $I(\infty)$ is the steady state current, $I_1$ is the first current value, $I_2$ is the current value, $t_1$ is the first time point, and $t_2$ is the second time point.

11. The method of claim 1, further comprising:
deriving a model of the electrical cable using the computed at least one parameter.

12. The method of claim 11, further comprising controlling a voltage applied at a load connected to a distal end of the electrical cable using the derived model.

13. The method of claim 1, further comprising updating the at least one parameter to account for a change in a characteristic of the electrical cable as a result of operation of a load system connected to a distal end of the electrical cable.

14. An apparatus for characterizing an electrical cable that is deployed in a well, comprising:
a voltage input source to apply a step voltage to a first end of an electrical cable wherein a load system is connected to a distal end of the electrical cable, wherein the step voltage comprises a voltage input that steps from a first voltage level to a second, higher voltage level, and wherein the second voltage level is less than an activation voltage for activating the load system; and
a cable parameter estimator coupled to the voltage input source, the cable parameter estimator to:
measure a current response of the electrical cable resulting from the applied step voltage, wherein the current response is measured at the first end of the electrical cable;
compute at least two parameters of the electrical cable according to the current response.

15. The apparatus of claim 14, wherein the current response is a current response for the electrical cable having an open-circuited distal end.

16. The apparatus of claim 15, wherein the at least two parameters comprises at least two of a resistance, an inductance, and a capacitance, and wherein the resistance, the inductance, and the capacitance are computed based on integrating the current response over time.

17. The apparatus of claim 14, wherein the current response is a current response for the electrical cable having a short-circuited distal end, wherein at least one parameter comprises a resistance computed based on dividing a voltage level of the step voltage by a steady state current and wherein at least one parameter comprises a capacitance computed based on the computed resistance and on a transient portion of the current response.

18. The apparatus of claim 17, wherein the distal end of the cable is short-circuited by connecting windings of a transformer to at least two conductors of the electrical cable.

19. A computer-readable medium containing a set of instructions that when executed cause a computer to:
receive a voltage input applied at a first end of an electrical cable that is deployed in a well;
receive a current response measured at the first end of the electrical cable and that results from the applied voltage input; and
compute at least two parameters of the electrical cable according to the current response, wherein a load system is connected to a distal end of the electrical cable, wherein the voltage input comprises a step voltage that steps from a first voltage level to a second, higher voltage level, and wherein the second voltage level is less than an activation voltage for activating the load system.

20. The article of claim 19, wherein computing the at least one parameter comprises computing a capacitance of the electrical cable and at least one of a resistance and inductance of the electrical cable by integrating the current response over time.

21. The article of claim 20, wherein the current response is the current response for the electrical cable having its distal end open-circuited.

22. The article of claim 19, wherein computing the at least two parameters comprises computing a resistance of the electrical cable by dividing a voltage level of the voltage input by a steady state current flowing in the electrical cable, and wherein the current response is the current response for the electrical cable having its distal end short-circuited.

23. The article of claim 22, wherein the distal end of the cable is short-circuited by connecting windings of a transformer to at least two conductors of the electrical cable.

\* \* \* \* \*